(12) United States Patent
Avraham et al.

(10) Patent No.: US 10,418,097 B2
(45) Date of Patent: Sep. 17, 2019

(54) NON-VOLATILE STORAGE SYSTEM WITH READ CALIBRATION

(71) Applicant: Western Digital Technologies, Inc., San Jose, CA (US)

(72) Inventors: David Avraham, Even-Yuheda (IL); Eran Sharon, Rishon Lezion (IL); Ran Zamir, Ramat Gan (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/822,798

(22) Filed: Nov. 27, 2017

(65) Prior Publication Data

US 2019/0164599 A1    May 30, 2019

(51) Int. Cl.
| G11C 16/06 | (2006.01) |
| G11C 11/56 | (2006.01) |
| G11C 16/28 | (2006.01) |
| G11C 29/52 | (2006.01) |
| G06F 11/10 | (2006.01) |
| G11C 7/14  | (2006.01) |
| G11C 29/42 | (2006.01) |

(52) U.S. Cl.
CPC ...... *G11C 11/5642* (2013.01); *G06F 11/1048* (2013.01); *G11C 7/14* (2013.01); *G11C 16/28* (2013.01); *G11C 29/42* (2013.01); *G11C 29/52* (2013.01); *G11C 2211/5634* (2013.01)

(58) Field of Classification Search
CPC ....... G11C 11/5642; G11C 7/14; G11C 16/28; G11C 29/42; G11C 29/52; G11C 2211/5634; G06F 11/1048

USPC ...................................................... 365/185.2
See application file for complete search history.

(56) References Cited

U.S. PATENT DOCUMENTS

| 7,814,401 | B2 | 10/2010 | Alrod |
| 8,099,652 | B1 | 1/2012 | Alrod |
| 8,503,237 | B1 | 8/2013 | Horn |
| 8,605,502 | B1 | 12/2013 | Desireddi |
| 8,782,495 | B2 | 7/2014 | Alrod |
| 8,811,076 | B2 | 8/2014 | Venkitachalam |
| 8,838,883 | B2 | 9/2014 | D'Abreu |
| 8,874,992 | B2 | 10/2014 | Desireddi |
| 9,697,905 | B2 | 7/2017 | Sharon |
| 9,728,263 | B2 | 8/2017 | Sharon |
| 2007/0091677 | A1 | 4/2007 | Lasser |
| 2008/0092026 | A1 | 4/2008 | Brandman |

(Continued)

OTHER PUBLICATIONS

Alrod, et al., "First Read Solution for Memory," U.S. Appl. No. 15/333,440, filed Oct. 25, 2016.

(Continued)

*Primary Examiner* — Huan Hoang
(74) *Attorney, Agent, or Firm* — Vierra Magen Marcus LLP

(57) ABSTRACT

Read reference levels are used to distinguish different data states for information stored in non-volatile memory. A storage system recalibrates its read reference levels, to maintain accuracy of the read process, by sensing samples of data for different test read reference levels and using those samples to determine an improved set of read reference levels. At least a subset of the test read reference levels used for the samples are dynamically and adaptively chosen based on indications of error for previous samples.

14 Claims, 13 Drawing Sheets

(56) References Cited

U.S. PATENT DOCUMENTS

| | | |
|---|---|---|
| 2008/0137412 A1 | 6/2008 | Ban |
| 2008/0263266 A1 | 10/2008 | Sharon |
| 2009/0135646 A1* | 5/2009 | Murin ................. G11C 11/5642 365/185.2 |
| 2009/0323422 A1 | 12/2009 | Alrod |
| 2010/0131697 A1 | 5/2010 | Alrod |
| 2010/0192042 A1 | 7/2010 | Sharon |
| 2011/0066902 A1 | 3/2011 | Sharon |
| 2011/0161775 A1 | 6/2011 | Weingarten |
| 2012/0140560 A1 | 6/2012 | Yang |
| 2012/0166913 A1 | 6/2012 | Alrod |
| 2012/0265927 A1 | 10/2012 | Cho |
| 2012/0268994 A1 | 10/2012 | Nagashima |
| 2013/0055047 A1 | 2/2013 | Sharon |
| 2013/0132652 A1 | 5/2013 | Wood |
| 2013/0275651 A1 | 10/2013 | D'Abreu |
| 2013/0290597 A1 | 10/2013 | Faber |
| 2013/0297988 A1 | 11/2013 | Wu |
| 2014/0143630 A1 | 5/2014 | Mu |
| 2014/0173172 A1 | 6/2014 | Yang |
| 2014/0269052 A1 | 9/2014 | Dusija |
| 2014/0281823 A1 | 9/2014 | Micheloni |
| 2014/0286102 A1 | 9/2014 | Wu |
| 2014/0355340 A1* | 12/2014 | Sharon ................... G11C 16/26 365/185.03 |
| 2014/0372678 A1 | 12/2014 | Moon |
| 2016/0092303 A1 | 3/2016 | Yang |
| 2017/0206023 A1* | 7/2017 | Motwani ............... G06F 3/0611 |

OTHER PUBLICATIONS

Alrod, et al., "Command Sequence for First Read Solution for Memory," U.S. Appl. No. 15/440,185, filed Feb. 23, 2017.

Peleato, et al., "Adaptive Read Thresholds for NAND Flash," IEEE Transactions on Communications, vol. 63, No. 9, Sep. 2015.

Hemo, et al., "Adaptive Threshold Read Algorithms in Multi-level Non-Volatile Memories," IEEE Journal on Selected Areas in Communications, vol. 32, Issue: 5, May 2014.

International Search Report and Written Opinion dated Aug. 13, 2014 in International Application No. PCT/US2014/038831.

International Preliminary Report on Patentability dated Dec. 10, 2015 in International Application No. PCT/US2014/038831.

Yang, Nian Niles et al. "Inspection of Non-Volatile Memory for Disturb Effects," U.S. Appl. No. 61/736,983, filed Dec. 13, 2012.

\* cited by examiner

Figure 3
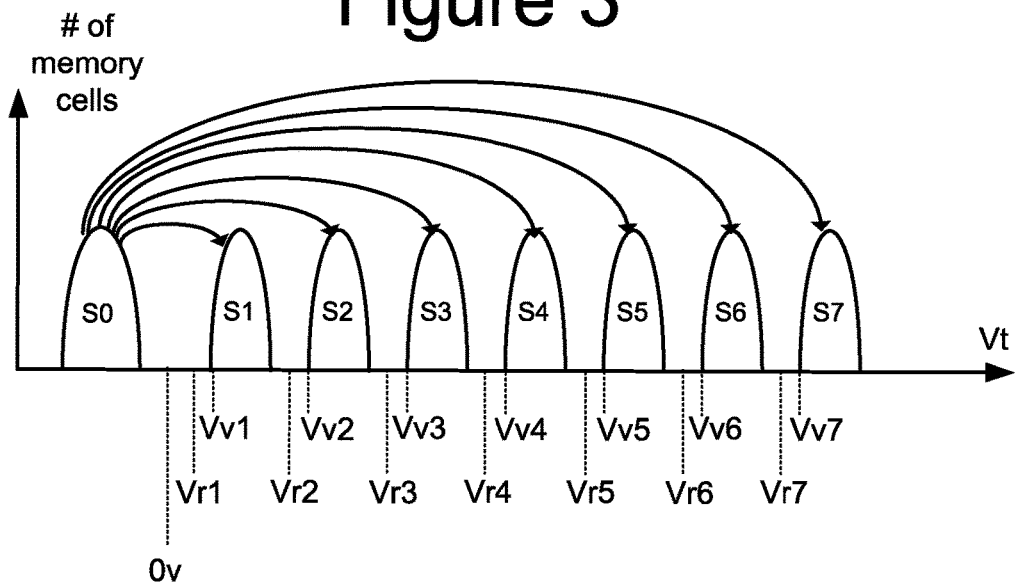
Figure 4
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
Figure 5
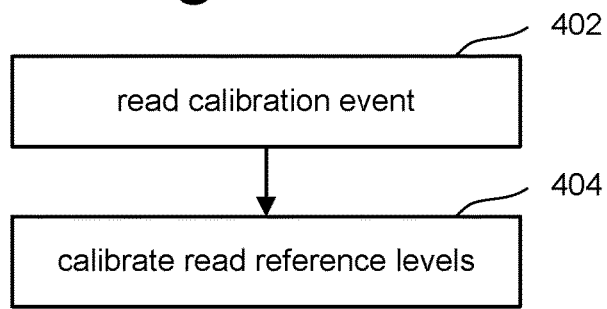

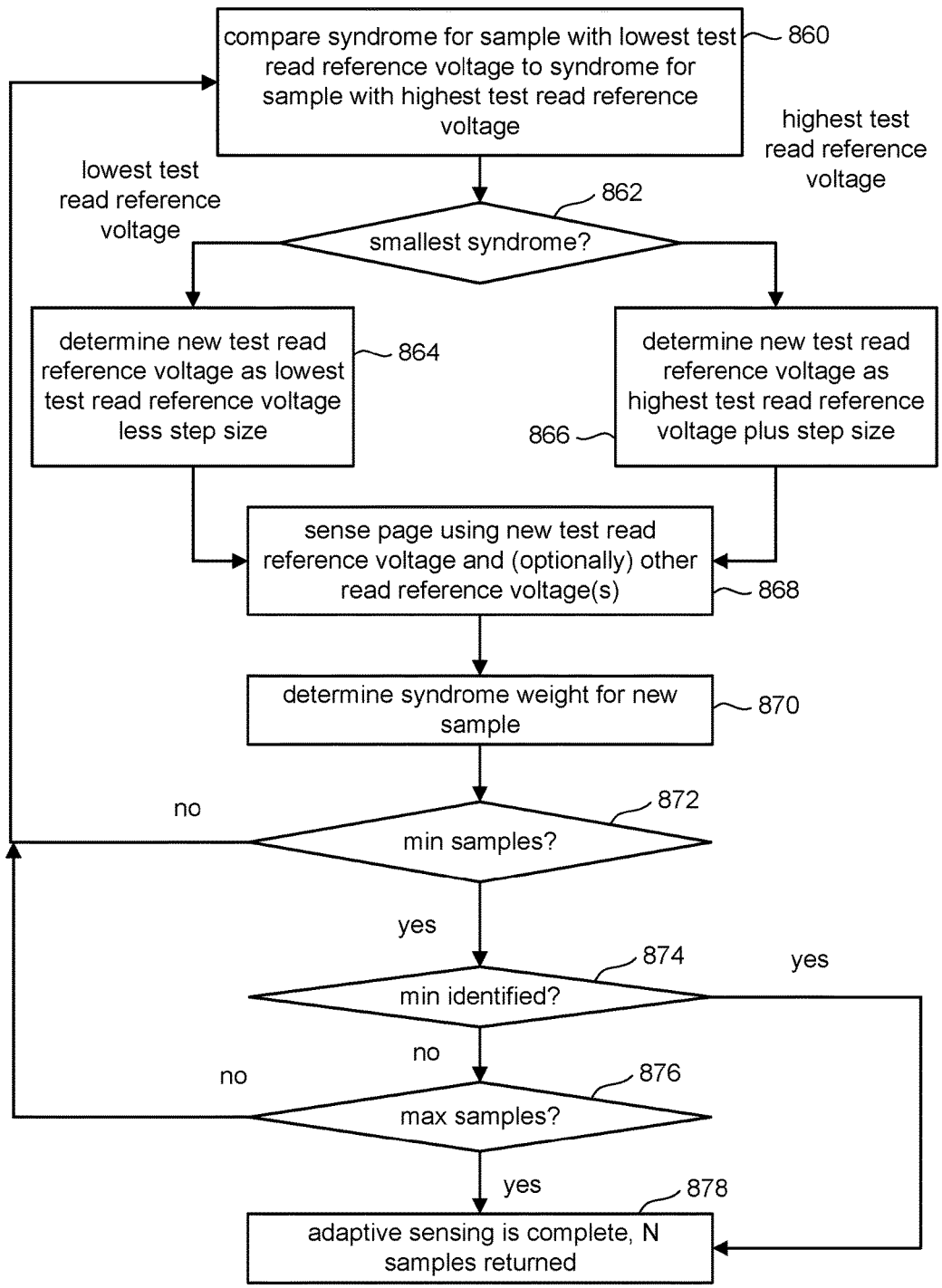

US 10,418,097 B2

NON-VOLATILE STORAGE SYSTEM WITH READ CALIBRATION

BACKGROUND

Semiconductor memory is widely used in various electronic devices such as cellular telephones, digital cameras, personal digital assistants, medical electronics, mobile computing devices, servers, solid state drives ("SSDs"), non-mobile computing devices and other devices. Semiconductor memory may comprise non-volatile memory or volatile memory. A non-volatile memory allows information to be stored and retained even when the non-volatile memory is not connected to a source of power (e.g., a battery).

When a storage system is deployed in or connected to an electronic device (the host), the storage system can be used to store data. It is important that once data is stored in a storage system, the data can be read back.

BRIEF DESCRIPTION OF THE DRAWINGS

Like-numbered reference numbers in the drawings refer to common components in the different figures.

FIG. 3 depicts threshold voltage distributions.

FIG. 4 is a table describing one example of an assignment of data values to data states.

FIG. 5 is a flow chart describing one embodiment of a process for read calibration.

FIG. 13 is a flow chart describing one embodiment of a process for performing adaptive sensing.

DETAILED DESCRIPTION

When reading data, it is typical to use a set of read reference levels (e.g., voltages) to determine the data being stored. The precision of these read reference levels is important to the process of successfully reading back stored data. However, over time the read reference levels may need to be changed or recalibrated to account for changes in environment (e.g., temperature) and/or changes in the data being stored (e.g., due to electron drift or other conditions that cause the data to be altered).

Recalibrating the read reference levels can be conducted through the process of applying a number of sensing operations and then sequentially calculating some metric according to different hypotheses related to the number of senses. The different sensing operations involve varying the read reference levels to create different samples that use different test read reference levels. In the past, the samples and their corresponding test read reference levels are determined in advance, which can be a problem if the samples do not include the appropriate test read reference levels. As the change in read reference levels cannot be predicted in advance, the predetermined different samples and their corresponding test read reference levels may not always be able to accurately identify what the new read reference levels should be. Therefore, it is proposed that at least a subset of the test read reference levels used for the samples are dynamically and adaptively chosen based on indications of error for previous samples.

One embodiment for recalibrating read reference levels comprises performing initial sensing of non-volatile memory cells using test read reference level and calculating indications of error for the initial sensing. Additional test read reference levels are chosen based on the indications of error for the initial sensing and additional sensing of the memory cells is performed using the additional test read reference levels. Updated read reference levels are determined based on the initial sensing and the additional sensing, and the updated read reference levels are used to perform read operations on host data stored in the memory.

Figure 1:
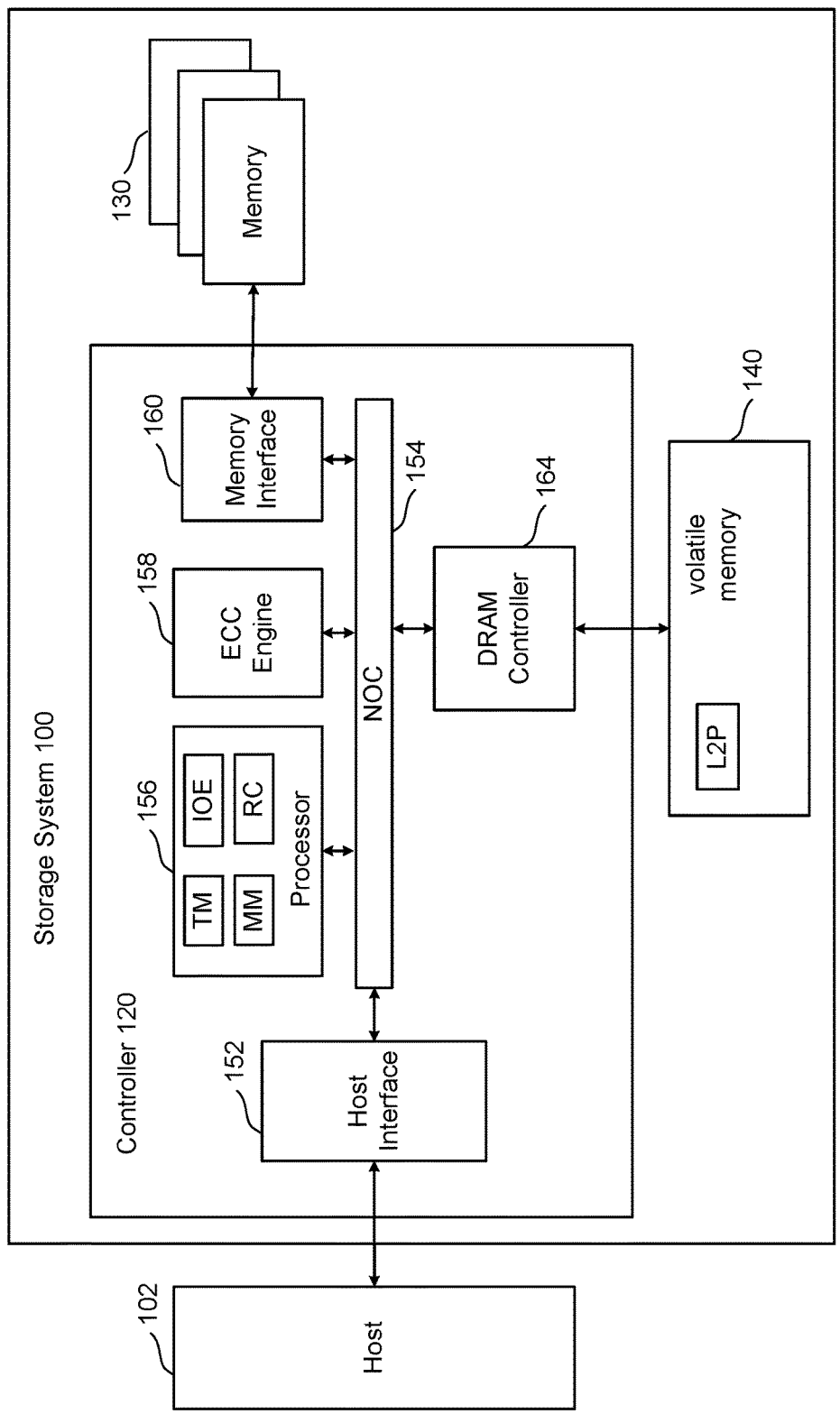
FIG. 1 is a block diagram depicting one embodiment of a storage system.

FIG. 1 is a block diagram depicting one embodiment of a storage system 100 that implements the proposed technology for recalibrating read reference levels. In one embodiment, storage system 100 is a SSD. Storage system 100 can also be a memory card, USB drive, server, embedded system or other type of storage system. The proposed technology for recalibrating read reference levels is not limited to any one type of storage system.

Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a controller 120 connected to non-volatile memory 130 and local high speed volatile memory 140 (e.g., DRAM). In one embodiment, non-volatile memory 130 comprises one or more memory die that each include a plurality of non-volatile memory cells. More information about the structure of memory 130 is provided below with respect to FIG. 2. Local high speed volatile memory 140 is used by controller 120 to perform various functions. For example, local high speed volatile memory 140 stores L2P tables (L2P), which are used to translate between logical addresses used by host 102 and physical addresses used by non-volatile memory 130.

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 are processor 156, ECC engine 158, memory interface 160, and DRAM controller 164. The DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. More details about error correction are provided below. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various memory operations. For example, memory module (MM) is a module/process running on processor 156 for performing programming, erasing, reading, as well as memory management processes. Read calibration manager (RC) is a module/process running on processor 156 for performing the read calibration process discussed herein. In one embodiment, read calibration manager (RC) is implemented as part of ECC Engine 158. Indication of error manager (IOE) is a module/process running on processor 156 for calculating an indication of error, which is used for the calibration of read reference levels. In one embodiment, indication of error manager (IOE) is implemented as part of ECC Engine 158 or as part of read calibration manager (RC). In one embodiment, processor 156 is programmed by firmware such that read calibration manager (RC) and indication of error manager (IOE) are firmware/software. In other embodiments, processor 156 is a custom and dedicated hardware circuit without any software. As will be discussed in more detail below, processor 156 (alone or with ECC engine 158) can perform recalibration of read reference levels in order to determine updated read reference levels, including dynamically and adaptively choosing test read reference levels for sensing sample data.

Processor 156 also implements a translation module (TM), as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module TM) performs address translation between the logical addresses used by the host and the physical addresses used by the memory dies. One example implementation includes maintaining tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in non-volatile memory 130 and a subset of the L2P tables are cached (L2P cache) in the local memory 140.

Memory interface 160 communicates with non-volatile memory 130. In one embodiment, memory interface 160 provides a Toggle Mode interface. In some example implementations, memory interface 160 (or another portion of controller 120) implements a scheduler and buffer for transmitting data to and receiving data from one or more memory die.

In one embodiment, non-volatile memory 130 comprises a set of one or more memory packages. Each memory package includes a bus that is connected to a plurality of memory die and a controller interface (which is an electrical circuit for interfacing with memory interface 160 of controller 120). In another embodiment, non-volatile memory 130 comprises one or more memory die that are not arranged in a memory package.

Figure 2:
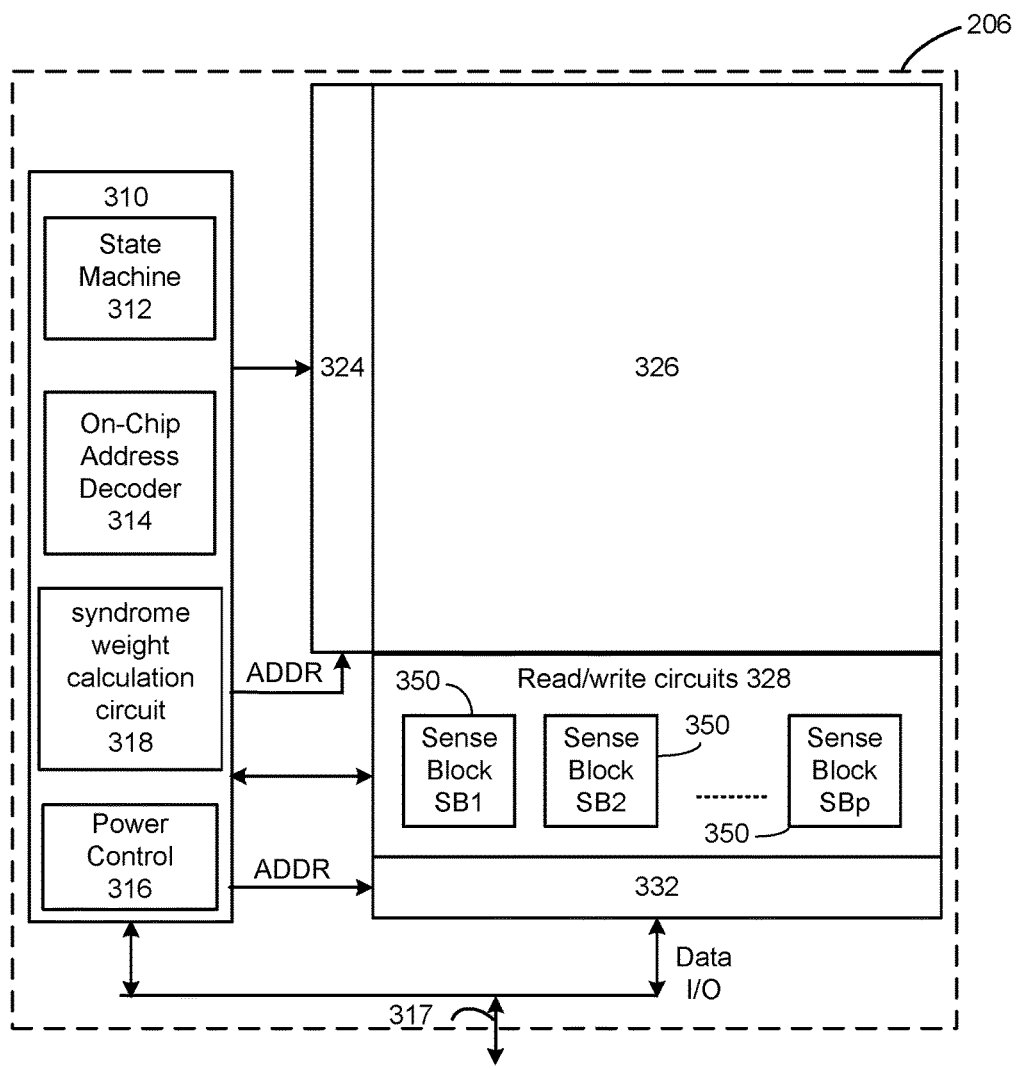
FIG. 2 is a block diagram of one embodiment of a memory die.

FIG. 2 is a functional block diagram of one embodiment of a memory die 206. The components depicted in FIG. 2 are electrical circuits. Memory die 206 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells (or multiple pages) to be read or programmed in parallel. Memory die 206 includes a set of input and/or output (I/O) lines 317 that connect to the controller.

Control circuitry 310 cooperates with the read/write circuits 328 to perform memory operations (e.g., erase, program, read, and others) on memory structure 326, and includes a state machine 312, an on-chip address decoder 314, syndrome weight calculation circuit 318 (optional) and a power control module 316. The state machine 312 provides die-level control of memory operations. In one embodiment, state machine 312 is programmable by software. In other embodiments, state machine 312 does not use software and is completely implemented in hardware (e.g., electrical circuits). In one embodiment, control circuitry 310 includes buffers such as registers, ROM fuses and other storage devices for storing parameters (e.g. read reference levels).

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages. The sense blocks include bit line drivers. Syndrome weight calculation circuit 318 is used to calculate syndrome weight (described below) or other indications of error.

State machine 312 and/or controller 120, as well as equivalently functioned circuits, are examples of one or more control circuits that perform the functions described herein. The one or more control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

In one embodiment, memory structure 326 comprises a three dimensional memory array of non-volatile memory cells in which multiple memory levels are formed above a single substrate, such as a wafer. The memory structure may comprise any type of non-volatile memory that is formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721, 662, incorporated herein by reference in its entirety. In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art. As such, the read reference levels refer to the appropriate reference criteria (e.g., voltage, current, magnetism, phase, etc.) for the memory technology implemented.

The memory discussed above can be erased, programmed (ie written) and read. In one embodiment, at the end of a successful programming process (with verification), the threshold voltages of the memory cells should be within one or more distributions of threshold voltages for programmed memory cells or within a distribution of threshold voltages for erased memory cells, as appropriate. FIG. 3 illustrates example threshold voltage distributions for the memory cell array when each memory cell stores three bits of data. Other embodiments, however, may use other data capacities per memory cell (e.g., such as one, two, four, or five bits of data per memory cell). FIG. 3 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 3 shows seven examples of read reference levels Vr1, Vr2, Vr3, Vr4, Vr5, Vr6, and Vr7 that are used for reading data from one embodiment of memory cells. In one embodiment, the read reference levels are voltages (read reference voltages) By testing (e.g., performing sense operations) whether the threshold voltage of a given memory cell is above or below the seven read reference levels, the system can determine what data state (i.e., S0, S1, S2, S3, . . . ) a memory cell is in. For example, if Vr1 is applied to a control gate of a flash memory cell and the flash memory cell turns on, then the flash memory cell is in data state S0. If the flash memory cell does not turn on in response to Vr1 but does turn on in response to Vr2 applied to its control gate then the flash memory cell is in data state S1.

FIG. 3 also shows seven example verify reference levels Vv1, Vv2, Vv3, Vv4, Vv5, Vv6, and Vv7. In one embodiment, the verify reference levels are voltages (verify reference voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2 (it should be not greater than Vr3). When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 7:
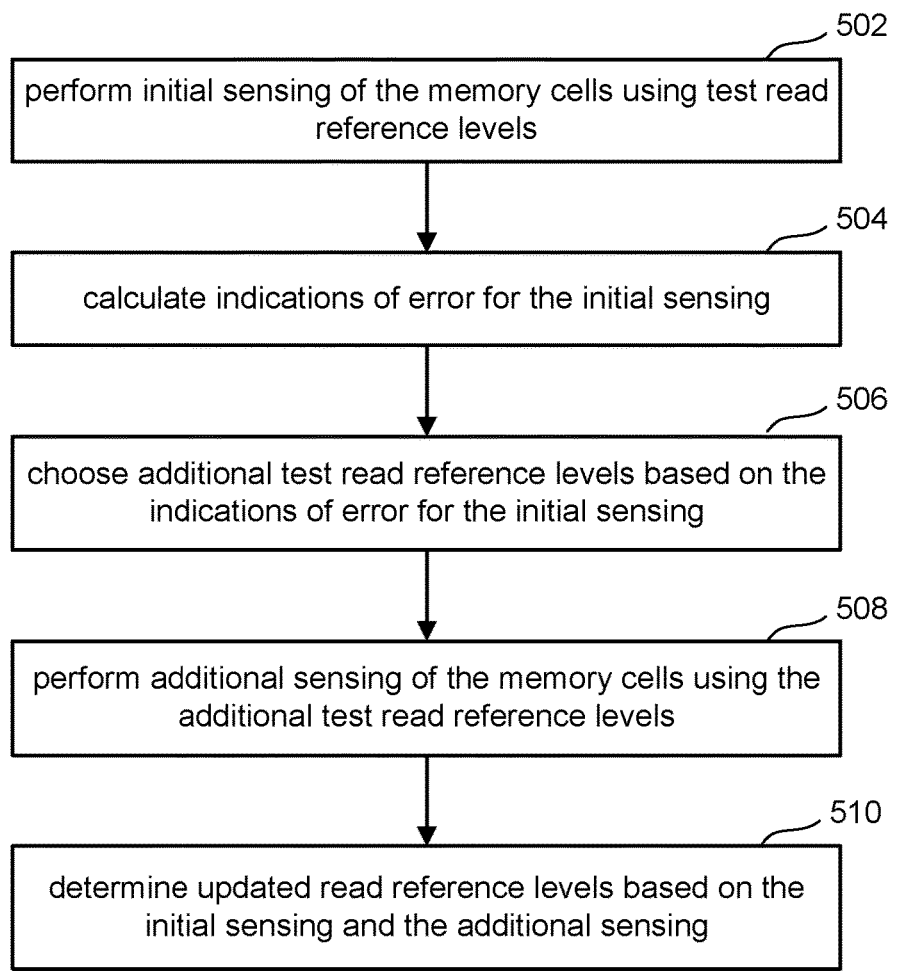
FIG. 7 is a flow chart describing one embodiment of a process for calibrating read reference levels.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7 represent the full sequence programming. The technology described herein can also be used with other types of programming in addition to full sequence programming (including, but not limited to, multiple stage/phase programming). In some embodiments, data states S1-S7 can overlap, with controller 120 relying on ECC to identify the correct data being stored.

FIG. 4 is a table describing one example of an assignment of data values to data states. In the table of FIG. 8, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 4, all bits stored in a memory cell are 1 when the memory cells is erased (e.g., in data state S0).

In one example implementation, all data stored in all memory cells connected to the same word line are in the same page and can be written/programmed and read together. In another embodiment, data stored in the memory cells are divided into multiple pages. For example, in an embodiment that stores three bits per memory cell, each bit within a memory cell will be in a different page. Thus, there will be three pages: upper page, middle page and lower page. FIG. 4 depicts one example of dividing the data into upper page, middle page and lower page. In one embodiment, data is read one page at a time. In some embodiments, data in programmed one page at a time while in other embodiments data is programmed concurrently for all pages stored in the memory cells connected to a common word line.

If only one of the pages needs to be read for data stored in the memory cells connected to a common word line, then only a subset of read reference levels needs to be used for the sensing operations. For example, in one embodiment, to read the upper page of data for memory cells connected to a common word line, two sensing operations need to be performed. During a first sensing operation, Vr3 is applied to the word line (control gates) and the system senses whether the memory cells turn on or remain off. During a second sensing operation, Vr7 is applied to the word line (control gates) and the system senses whether the memory cells turn on or remain off. If a memory cell turns on in response to Vr3 or does not turn on in response to Vr7, then the upper page data is 1. If a memory cell does not turn on in response to Vr3 and does turn on in response to Vr7, then the upper page data is 0.

In one embodiment, to read the middle page of data for memory cells connected to a common word line, three sensing operations need to be performed using Vr2, Vr4 and Vr6. During a first sensing operation, Vr2 is applied to the word line (control gates) and the system senses whether the memory cells turn on or remain off. During a second sensing operation, Vr4 is applied to the word line (control gates) and the system senses whether the memory cells turn on or remain off. During a third sensing operation, Vr6 is applied to the word line (control gates) and the system senses whether the memory cells turn on or remain off. If a memory cell turns on in response to Vr2, then the middle page data is 1. If a memory cell does not turn on in response to Vr2 and Vr4, but does turn on in response to Vr6, then the middle page data is also 1. The middle page data is 0 if either (1) a memory cell does not turn on in response to Vr2 and does turn on in response to Vr4 or (2) the memory cell does not turn on in response to Vr6.

In one embodiment, to read the lower page of data for memory cells connected to a common word line, two sensing operations need to be performed using Vr1 and Vr5. During a first sensing operation, Vr1 is applied to the word line (control gates) and the system senses whether the memory cells turn on or remain off. During a second sensing operation, Vr5 is applied to the word line (control gates) and the system senses whether the memory cells turn on or remain off. If a memory cell turns on in response to Vr1 or does not turn on in response to Vr5, then the lower page data is 1. If a memory cell does not turn on in response to Vr1 and does turn on in response to Vr5, then the lower page data is 0.

Sometimes the threshold voltages of the memory cells move over time due to migration of charge, change in temperature, capacitive coupling or other reasons. This causes the threshold voltage distributions depicted in FIG. 3 to shift. When the threshold voltage distributions shift, the read reference levels will need to be adjusted or calibrated in order for the read reference levels to remain accurate so that errors can be avoided or minimized. This scenario is depicted in the flow chart of FIG. 5. In step 403, a read calibration event occurs. For example, if a read process fails then the system may choose to calibrate the read reference levels and try to read again. Some storage systems may perform calibration in response to a change in temperature by at least some threshold. In other systems, calibration is performed periodically. In response to the read calibration event, in step 404 the system calibrates the read reference levels. In some embodiments, there will be different read reference levels for each word line, block, set of blocks, plane of a memory die, or entire memory die. The calibration process can be for all sets of the read reference levels or a subset.

Figure 6:
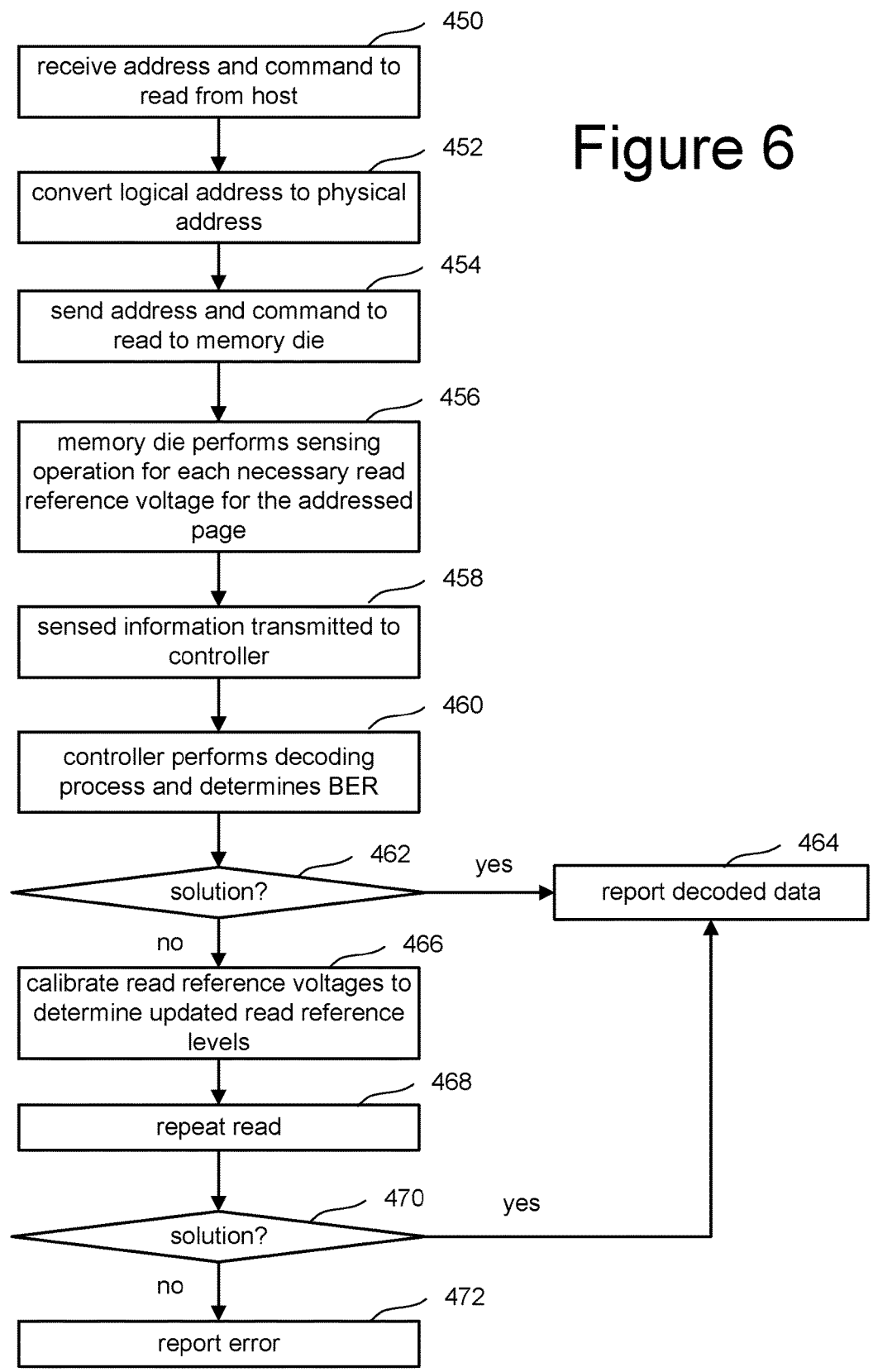
FIG. 6 is a flow chart describing one embodiment of a process for reading.

FIG. 6 is a flow chart describing one embodiment of a process for reading that includes a read calibration event (e.g., a read failure) and a calibration operation. In step 450, controller 120 receives a command to read data and a logical address from host 102 (via host interface 152). In step 452, controller 120 converts the logical address received in step 450 to a physical address for non-volatile memory 130 using translation manager TM and the L2P tables. In step 454, controller 120 sends the physical address and a command to read data to the appropriate memory die 206 of non-volatile memory 130. In step 456, in response to the command, memory die 206 senses information from the addressed page or pages. In one embodiment, the address sent from controller 120 to memory die 206 is a page address and step 456 includes sensing the data state for the memory cells at the addressed page. In step 458 the sensed information is transmitted from memory die 206 to controller 120.

Figure 10:
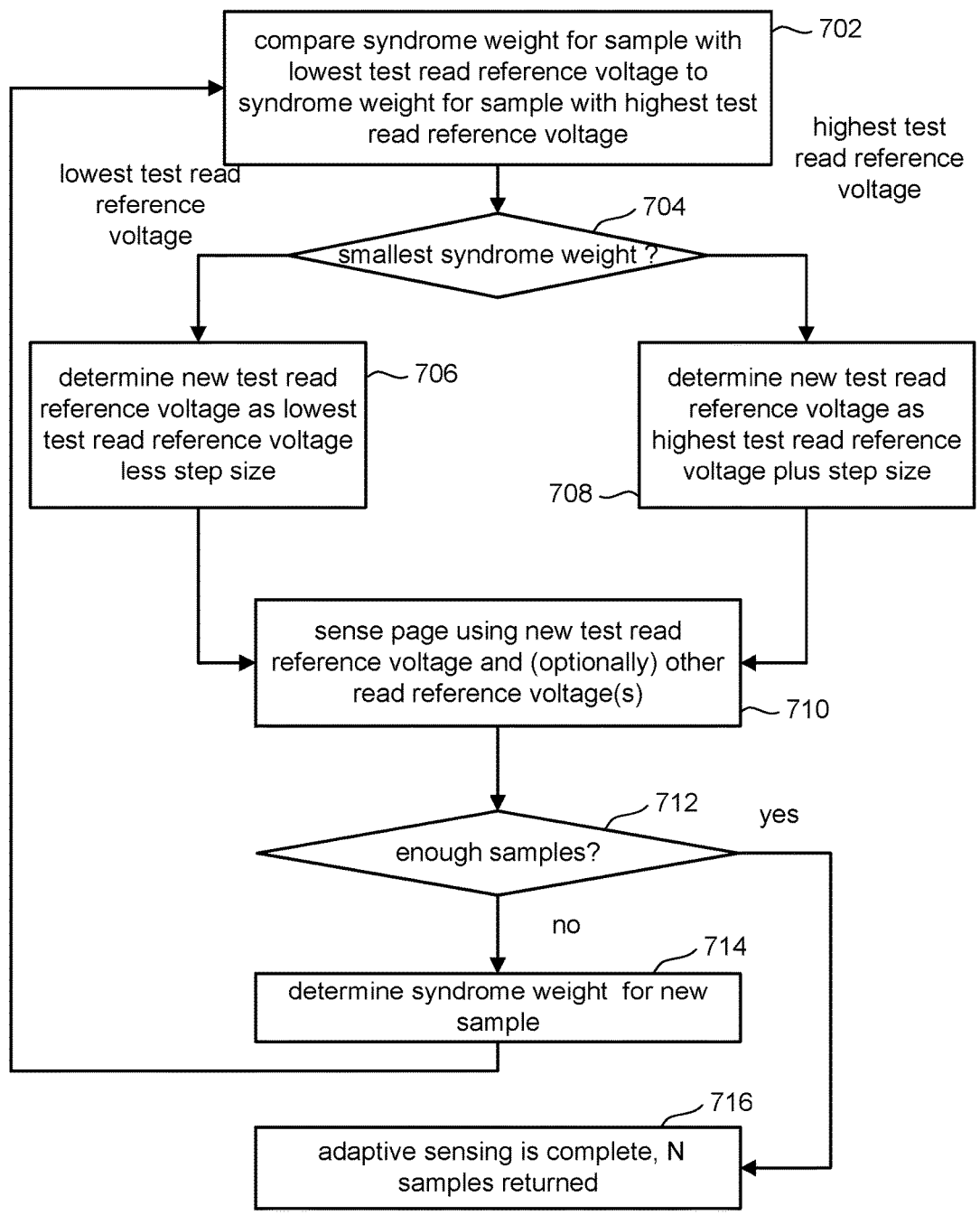
FIG. 10 is a flow chart describing one embodiment of a process for performing adaptive sensing.

In step 460 of FIG. 10, controller 120 performs the ECC decoding process (see ECC engine 158). To help fix errors that can occur when storing data, error correction is used. During the programming process, ECC engine 158 encodes the data to add ECC information. For example, ECC engine 158 is used to create code words. In one embodiment, data is programmed in units of pages. Because it is possible that errors can occur when programming or reading, and errors can occur while storing data (e.g., due to electrons drifting, data retention issues or other phenomenon), error correction is used with the programming of a page of data. Many error correction coding schemes are well known in the art. These conventional error correction codes (ECC) are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other embodiments, the actual data is changed.

The particular parameters for a given error correction code include the type of code, the size of the block of actual data from which the code word is derived, and the overall length of the code word after encoding. For example, a typical BCH code applied to 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives host data, also referred to as information bits, that is to be stored in a memory structure 326. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used which implements error correction decoding corresponding to the encoding implemented in controller 120. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0 \mid Y)}{P(v=1 \mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 120 receives the code word Y1 and the LLRs and iterates in successive iterations in which it determines if parity checks (equations) of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Looking back at step 460 of FIG. 6, in one embodiment, the input of the decoding process is the information sensed in step 456. If the decoding process is successful, the output of the decoding process will be a data solution representing the data stored in the non-volatile memory. Additionally, the decoding process will identify how many errors were found in the data and were corrected by the decoding process using error correction. The number of data bits that were in error and were corrected are referred to as the bit error rate (BER). If the decoding process successfully finds a solution (step 462), then controller 120 reports the decoded data in step 464. In one embodiment, the data is reported to host 102. In other embodiments, data can be used for another process within controller 120. The BER is stored by controller 120 for analytics, logging, and/or used for predicting defects. If, in step 462 it is determined that the decoding process did not successfully find a correct solution, then in step 466 controller 120 calibrates the read reference levels (e.g., read reference voltages) to determine updated read reference levels (e.g., updated read reference voltages). In step 468, the system performs the read process again (steps 454-462) using the updated read reference levels. If the decoding process successfully finds a solution (step 470), then controller 120 reports the decoded data in step 464. If, in step 470 it is determined that the decoding process did not successfully find a correct solution, then in step 472 controller 120 returns an error message. The error message can be returned to host 102 or to another process in controller 120.

FIG. 7 is a flow chart describing one embodiment of a process for calibrating read reference levels. That is, the process of FIG. 7 is one example implementation of step 466 of FIG. 6 or step 404 of FIG. 5. In general, the calibration process includes varying the read reference values by a step size to create a set of test read reference values, sensing samples of data for each of the test read reference values and determining which test read reference values minimize error. The different samples of data are of the same page of data using the different test read reference values.

In step 502 of FIG. 7, initial sensing of the memory cells is performed using test read reference levels. In one embodiment, a page of data will be read multiple times using different test read reference values. As discussed above, in one embodiment the read reference levels are voltages and the sensing is performed on the memory die at the control of the state machine 312 in response to commands from controller 120. The initial sensing can include one sensing operation, two sending operations, three sensing operations or another number of sensing operations. In one embodiment, the initial sensing of step 502 are predetermined sensing operations using a predetermined set of test read reference levels.

In step 504, one or more indications of error are calculated for the initial sensing of step 502. The indications of error can be calculated by indication of error manager (TOE), ECC engine 158 or syndrome weight calculation circuit 318. One example of an indication of error is the bit error rate (BER). Another example of an indication of error is the length of time needed to decode the information sensed. In other implementations, latency associated with fully decoding may be avoided by estimating a bit error rate (BER) or number of errors without fully decoding. For example, indication of error manager (TOE), ECC engine 158 or syndrome weight calculation circuit 318 may generate a syndrome weight indicating a number of parity check equations that are unsatisfied for information sensed from the memory cells. The syndrome weight generally indicates a relative amount of errors in each of the samples.

In step 506, additional test read reference levels are chosen based on the indications of error for the initial sensing. In one embodiment, the controller 120 or state machine 312 chooses additional test read reference levels by varying one or more of the test read reference levels based on indications of error for the initial sensing. In step 508, additional sensing of the memory cells is performed on the memory die 206 using the additional test read reference levels.

In step 510, updated read reference levels are determined by read calibration manager RC of controller 120 (or the state machine) based on the initial sensing and the additional sensing. That is, steps 502 and 508 include reading the same page of data to create multiple samples, with each sample being read using a different set of read reference levels. Step 510 includes a process for choosing the set of read reference levels that minimizes or eliminates errors in the data read. This can include choosing one of the sets of read reference levels used with the sensing of steps 502 and 508 or interpolating to identify optimal read reference levels. One example of a process for choosing the set of read reference levels can be found in U.S. Pat. No. 9,697,905, incorporated herein by reference in its entirety.

Consider an example where an upper page (see FIG. 4) of data is being read from a set of memory cells connected to a common word line and there is an error that requires the read reference levels to be calibrated (step 466 of FIG. 6) prior to re-trying the read process (step 468 of FIG. 6). To read the upper page, the read reference levels Vr3 and Vr7 are used; therefore, read reference levels Vr3 and Vr7 will be calibrated by performing the process of FIG. 7. In one embodiment, the process of FIG. 7 is performed separately for each read reference level being calibrated so in this example the process of FIG. 7 is performed a first time for Vr3 and then performed a second time for Vr7. When the process of FIG. 7 is performed a first time for Vr3, Vr7 is kept constant and Vr3 is varied. For example, the initial sensing of step 502 includes sensing the upper page of data once using Vr3 and Vr7 and a second time using Vr3+$\Delta$ and Vr7, where $\Delta$ is a step size. Examples of step sizes include 0.1 v, 0.15 v, and 0.2 v. Other step sizes can also be used. No particular step size is required. In step 506, additional test values will be chosen. For example, Vr3+2$\Delta$, Vr3+3$\Delta$ and Vr3+4$\Delta$ can be chosen so that in step 508 a third sensing of the upper page is performed using Vr3+2$\Delta$ and Vr7, a fourth sensing of the upper page is performed using Vr3+3Δ and Vr7, and a fifth sensing of the upper page is performed using Vr3+4Δ and Vr7. Note that the different test read reference levels for Vr3 need not be differ by multiples of the same Δ, such that the variance between test read reference levels can be non-uniform.

The second time the process of FIG. 7 is performed (ie for Vr7), the initial sensing of step 502 can include sensing the upper page of data once using Vr3 and Vr7 and a second time using Vr3 and Vr7+Δ. In step 506, Vr7+2Δ, Vr7+3Δ and Vr7−2Δ can be chosen so that in step 508 a third sensing of the upper page is performed using Vr3 and Vr7+2Δ, a fourth sensing of the upper page is performed using Vr3 and Vr7+3Δ, and a fifth sensing of the upper page is performed using Vr3 and Vr7−2Δ.

Figure 8A:
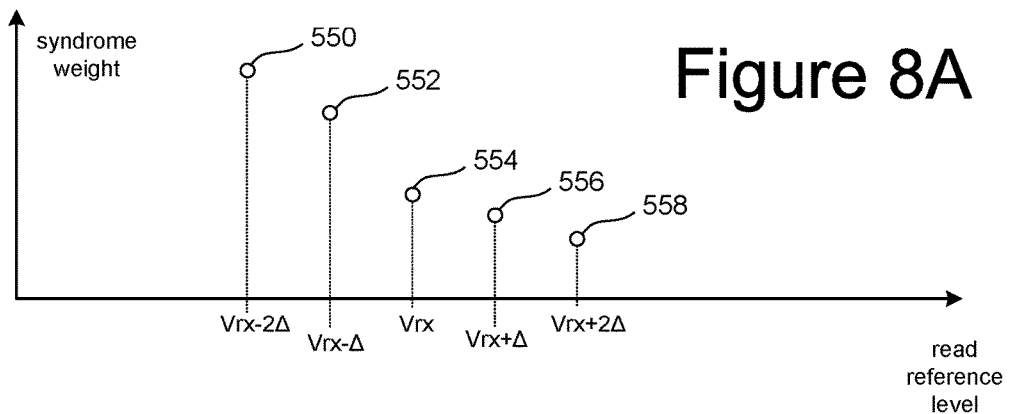
FIGS. 8A-C are graphs plotting syndrome weight versus read reference voltage.

As discussed above, one example of an indication of error is syndrome weight. Other types of indication of error can also be used. FIG. 8A is a graph of syndrome weight (y axis) plotted against read reference level (x axis). FIG. 8A shows data for five read reference levels: syndrome weight 550 for read reference level Vrx−2Δ, syndrome weight 552 for read reference level Vrx−Δ, syndrome weight 554 for read reference level Vrx, syndrome weight 556 for read reference level Vrx+Δ, syndrome weight 558 for read reference level Vrx+2Δ. For example, when data is sensed using Vrx−2Δ, the syndrome weight is calculated to be value 550. A low syndrome weight is a relative indication of a low number of errors. In the example of FIG. 8A, Vrx−2Δ, Vrx−Δ, Vrx, Vrx+Δ and Vrx+2Δ are test read reference levels.

Figure 8B:
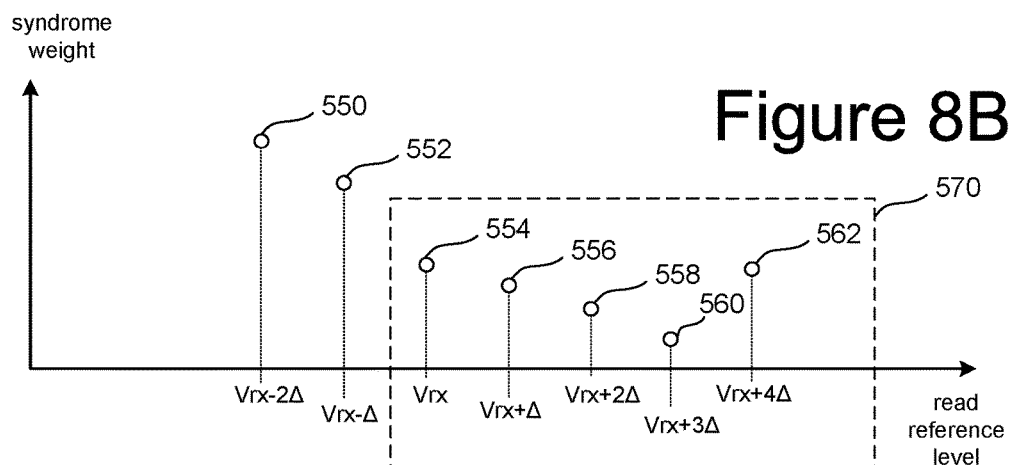

When performing a calibration of read reference levels, if the complete set of test read reference levels is predetermined it may work out that the optimal read reference level is not found. For example, in FIG. 8A the lowest syndrome weight is syndrome weight 558 for read reference level Vrx+2Δb. However, it cannot be known from the data of FIG. 8A whether syndrome weight 558 is the actual lowest syndrome weight or even near the lowest syndrome weight. FIG. 8B shows the data of FIG. 8A plus two additional data points: syndrome weight 560 for read reference level Vrx+3Δ and syndrome weight 562 for read reference level Vrx+4Δ. From the graph of FIG. 8B, it ca be seen that syndrome weight 560 represents a minima, between higher syndrome weights 558 and 562. Therefore, it would be better to use syndrome weights 554-562 rather than 550-558. Having the complete set of test read reference levels predetermined may result in less than optimal samples, as depicted in FIG. 8A. Having at least a subset of the test read reference levels determined dynamically (on the fly or on a rolling basis) based on the indication of error (e.g., syndrome weights) of previous samples allows for more optimal samples, such as depicted in FIG. 8B.

Figure 9:
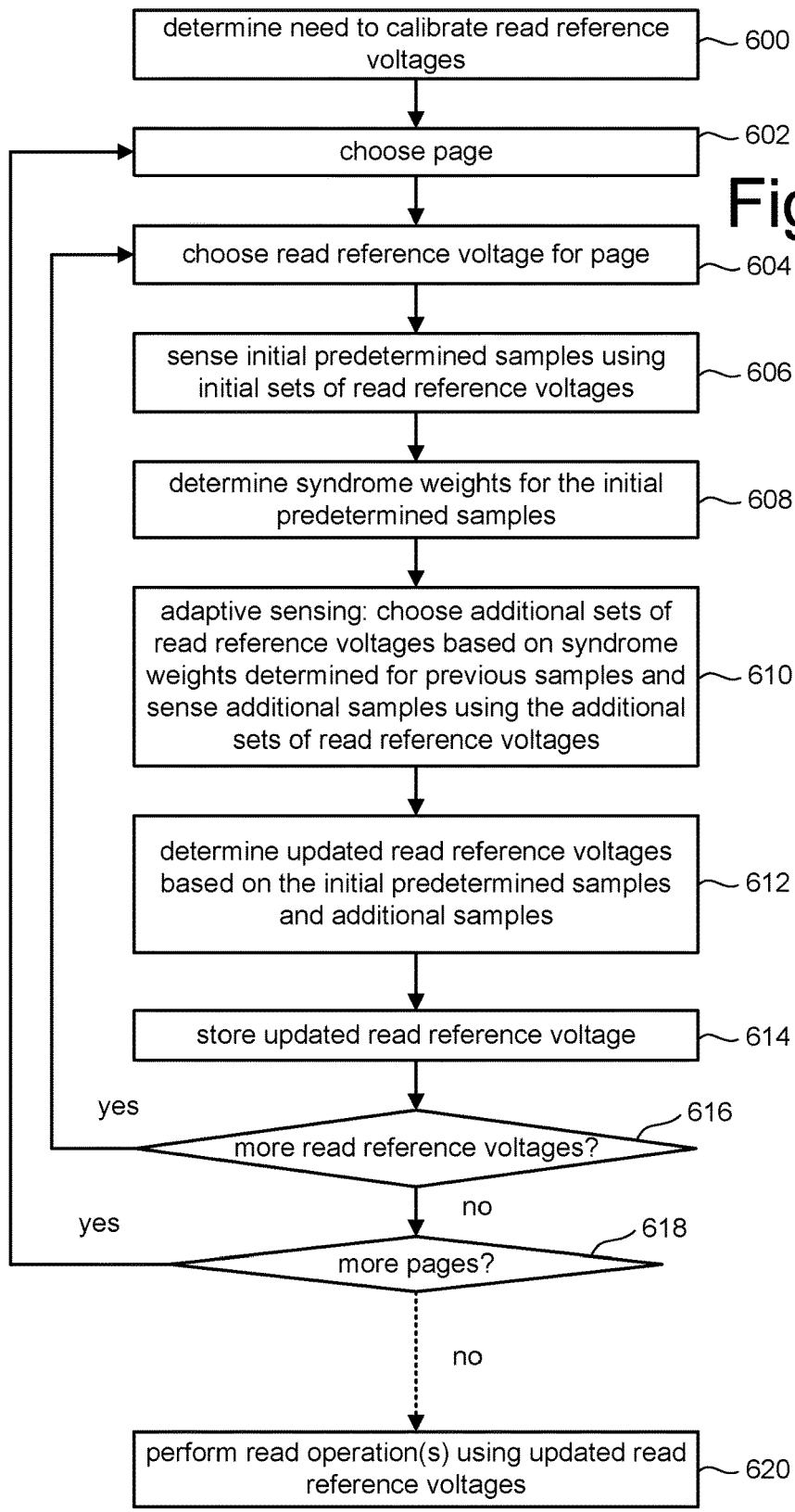
FIG. 9 is a flow chart describing one embodiment of a process for calibrating read reference levels.

FIG. 9 is a flow chart describing one embodiment of a process for calibrating read reference levels. The process of FIG. 9 represents more details of one example implementation of the process of FIG. 7 where the read reference levels are read reference voltages and the indication of error is syndrome weight. In step 600, the system determine that the read reference voltages need to be calibrated. For example, a page of data was not able to be successfully read, there was a temperature change or a predetermined amount of time has elapsed. In step 602, a page is chosen. For example, a page that had an error can be chosen. If there was a change in temperature or a period has elapsed, a random page in a random block can be chosen. The process of FIG. 9 can be performed for one page or multiple pages. In one embodiment, reading a page of data relies on a set of read reference voltages. Step 602 includes choosing one of the read reference voltages for the page chosen in step 602. Steps 600-602 can be performed by the controller or the state machine.

Step 606 includes the memory die 206 sensing initial predetermined samples using initial sets of read reference voltages. Using the example discussed above for reading an upper page, step 604 may include sensing a first sample using V3 and Vr7 and a second sample using Vr3+Δ and Vr7. In step 608, indication of error manager (IOE) or syndrome weight calculation circuit 318 determines syndrome weights for the initial predetermined samples. For example, looking at FIG. 8B, step 608 can include calculating syndrome weight 554 and syndrome weight 556.

In step 610, adaptive sensing is performed, which includes choosing additional sets of read reference voltages based on syndrome weights determined for previous samples and sensing additional samples using the additional sets of read reference voltages. More details of the adaptive sensing of step 610 is described below with respect to FIGS. 10 and 11. Looking at FIG. 8B, step 610 can include choosing Vrx+2Δ, Vrx+3Δ and Vr3+4Δ. In step 612, updated read reference voltages are determined based on the initial predetermined samples and additional samples, as discussed above. For example, looking at FIG. 8B, the samples for Vrx, Vrx+Δ, Vrx+2Δ, Vrx+3Δ and Vrx+4Δ (collective denoted by box 570) are used to determine that Vrx+3Δ is the updated read reference voltage to replace existing read reference voltage Vrx. The updated read reference voltage is stored as a parameter in step 614. If there are more read reference voltages to update (step 616), then the process loops back to step 604 top operate on the other read reference voltage. For example, if the chosen page is an upper page and Vr3 was just updated then the process loops back to step 604 to start the update for Vr7. If there are no more read reference voltages to update for the current page (step 616), then it is determined whether there are more pages to perform calibration for in step 618. If there are more pages to perform calibration for, then the process loops back to step 602 and chooses the next page; otherwise, the calibration is complete. FIG. 9 shows a dotted line from step 618 to step 620 to represent that at some time subsequent to calibration being complete, a read operation is performed for a set of memory cells using the updated read reference levels.

FIG. 10 is a flow chart describing one embodiment of a process for performing adaptive sensing. That is, the process of FIG. 10 is one example implementation of step 610 of FIG. 9. In one embodiment, the process of FIG. 10 is performed at the direction of controller 120, such as by read calibration manager (RC). In another embodiment, the process of FIG. 10 is performed entirely on the memory die 206 at the direction of the state machine. In one embodiment, the process of FIG. 10 comprises the one or more control circuits configured to choose additional read reference levels (e.g., voltages) based on the indications of error (e.g., syndrome weight) for the initial sensing by comparing an indication of error for a sample with the lowest test read reference level to an indication of error for a sample with the highest test read reference level, choosing a new test read reference level that is lower than the lowest test read reference level if the indication of error for the sample with the lowest test read reference level is lower than the indication of error for the sample with the highest test read reference level and choosing a new test read reference level that is higher than the highest test read reference level if the indication of error for the sample with the highest test read reference level is lower than indication of error for the sample with the lowest test read reference level.

In step 702 of FIG. 10, the system compares the syndrome weight (or other indication of error) for the sample with the lowest test read reference voltage to the syndrome weight for the sample with the highest test read reference voltage. Looking back at FIG. 8, if the initial samples were for Vrx and Vrx+Δ, then Vrx is the lowest test read reference voltage and Vrx+Δ is the highest test read reference voltage when the adaptive sensing starts. If the syndrome weight for the sample with the lowest test read reference voltage is less than the syndrome weight for the sample with the highest test read reference voltage (step 704), then in step 706 the new test read reference voltage is chosen to be the lowest test read reference voltage less a step size (or less a different amount). If the syndrome weight for the sample with the highest test read reference voltage is less than the syndrome weight for the sample with the lowest test read reference voltage (step 704), then in step 708 the new test read reference voltage is chosen to be the highest test read reference voltage plus a step size (or plus a different amount). Steps 702-708 can be performed by controller 120 (read calibration manager RC) or state machine 312.

After steps 706 or 708, the process continues at step 710 in which memory die 206 senses the page of data using the new test read reference voltage, as well as other read reference voltages (if necessary to sense the page of data). In step 712, it is determined whether enough samples of data have been collected. In one embodiment, the system collects five samples of data for each read reference voltage that is calibrated. Step 712 is performed by controller 120 (read calibration manager RC) or state machine 312. If there are not enough samples yet, then in step 714 indication of error manager (IOE) or syndrome weight calculation circuit 318 calculates a syndrome weight (or other indication of error) for the sample just sensed in the most recent performance of step 710. After step 714, the process continues at 702 to choose another sample. If, in step 712, it is determined that the there are enough samples, then the adaptive sensing is complete and N (e.g., N=5) samples are returned in step 716.

FIG. 8B can be used to illustrate an example application of FIGS. 9 and 10. Step 606 of FIG. 9 can include sensing samples for Vrx and Vrx+Δ. Step 610 of FIG. 9 includes performing the process of FIG. 10. When performing the process of FIG. 10, the first time step 702 is performed the only samples are Vrx and Vrx+Δ of FIG. 8B; therefore, (since syndrome weight 556 is lower than syndrome weight 554), the new test read reference voltage determined in step 708 is Vrx+2Δ. The second time step 702 is performed, the existing samples are Vrx, Vrx+Δ and Vrx+2Δ; therefore, (since syndrome weight 560 is lower than syndrome weight 554), the new test read reference voltage determined in step 708 Vrx+3Δ. The third time step 702 is performed, the existing samples are Vrx, Vrx+Δ, Vrx+2Δ and Vrx+3Δ; therefore, (since syndrome weight 558 is lower than syndrome weight 554), the new test read reference voltage determined in step 708 Vrx+4Δ.

Figure 8C:
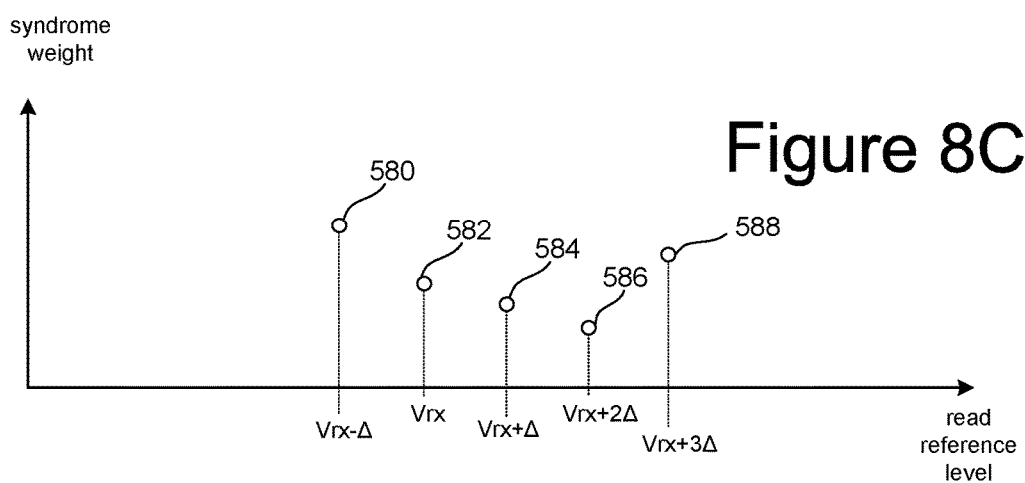

FIG. 8C illustrates another example application of FIGS. 9 and 10. Step 606 of FIG. 9 can include sensing samples for Vrx and Vrx+Δ. When performing the process of FIG. 10, the first time step 702 is performed the only samples are Vrx and Vrx+Δ of FIG. 8C; therefore, (since syndrome weight 584 is lower than syndrome weight 582), the new test read reference voltage determined in step 708 is Vrx+2Δ. The second time step 702 is performed, the existing samples are Vrx, Vrx+Δ and Vrx+2Δ; therefore, (since syndrome weight 586 is lower than syndrome weight 582), the new test read reference voltage determined in step 708 Vrx+3Δ. The third time step 702 is performed, the existing samples are Vrx, Vrx+Δ, Vrx+2Δ and Vrx+3Δ; therefore, (since syndrome weight 582 is lower than syndrome weight 588), the new test read reference voltage determined in step 708 Vrx−Δ.

Figure 11:
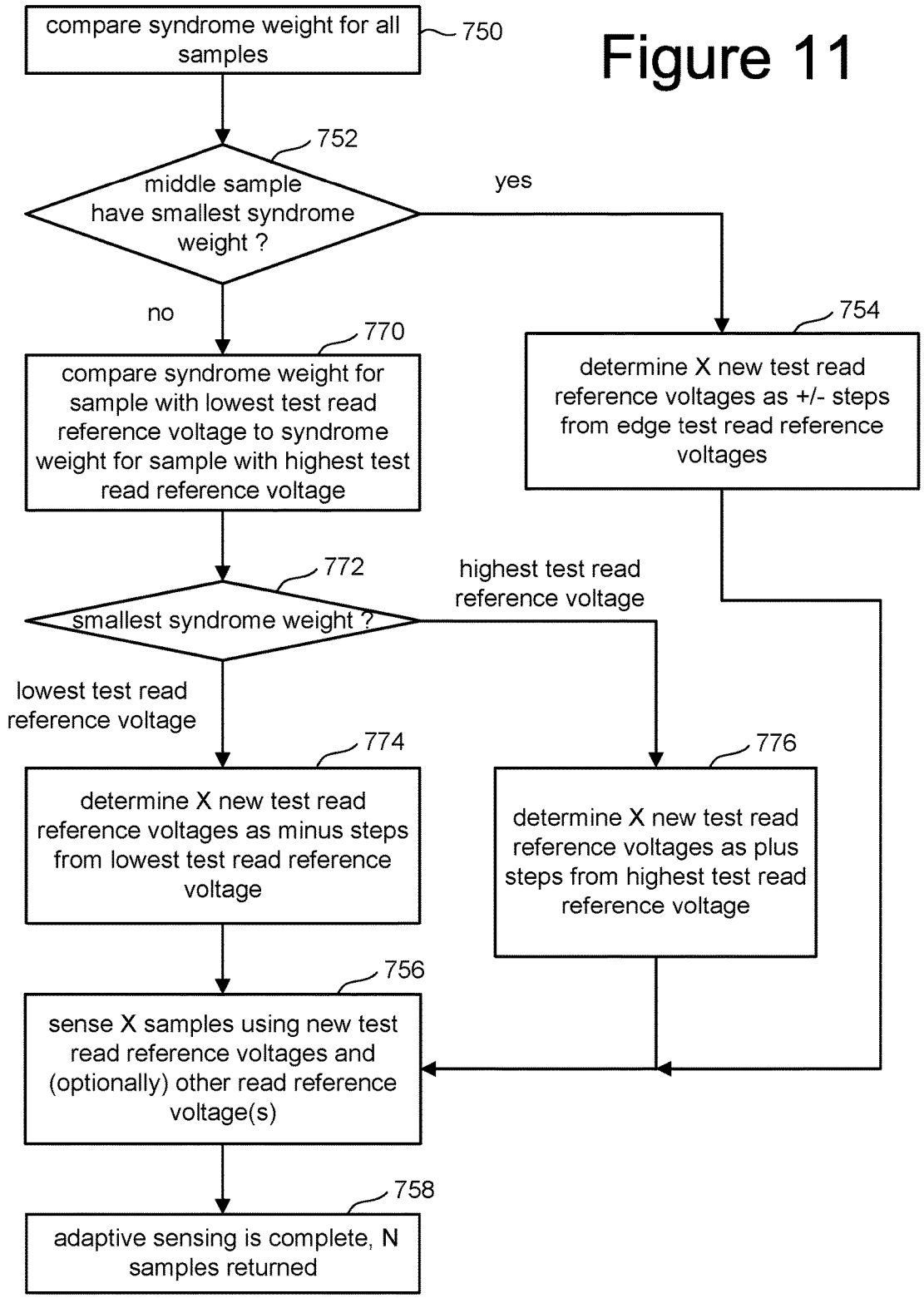
FIG. 11 is a flow chart describing one embodiment of a process for performing adaptive sensing.

In some embodiments, memory die 206 can perform pipelined read operations such that controller 120 can send an instruction to memory die 206 to perform multiple read operations. FIG. 11 is a flow chart describing one embodiment of a process for performing adaptive sensing for embodiments where the memory die 206 can performed pipelined read operations. That is, the process of FIG. 11 is one example implementation of step 610 of FIG. 9. In one embodiment, the process of FIG. 11 is performed at the direction of controller 120, such as by read calibration manager (RC). In another embodiment, the process of FIG. 11 is performed entirely on the memory die 206 at the direction of the state machine.

In one embodiment, the process of FIG. 11 includes the initial sensing of the memory cells using test read reference levels comprising reading a page of data three times to create three samples including a first sample that uses a first magnitude for the first read reference level, a second sample that uses a second magnitude for the first read reference level that is larger than the first magnitude, and a third sample that uses a third magnitude for the first read reference level that is larger than the second magnitude; the additional sensing comprises reading the page of data twice to create two more samples; the two more samples comprises reading the page of data using a magnitude for a first read reference level that is lower than the first magnitude and reading the page of data using a magnitude for the first read reference level that is higher than the third magnitude if the second sample has an indication of error that is lower than the first sample and the third sample; the two more samples comprises reading the page of data using magnitudes for the first read reference level that are lower than the first magnitude if the first sample has an indication of error that is lower than the second sample and the third sample; and the two more samples comprises reading the page of data using magnitudes for the first read reference level that are higher than the third magnitude if the third sample has an indication of error that is lower than the first sample and the second sample.

Figure 11A:
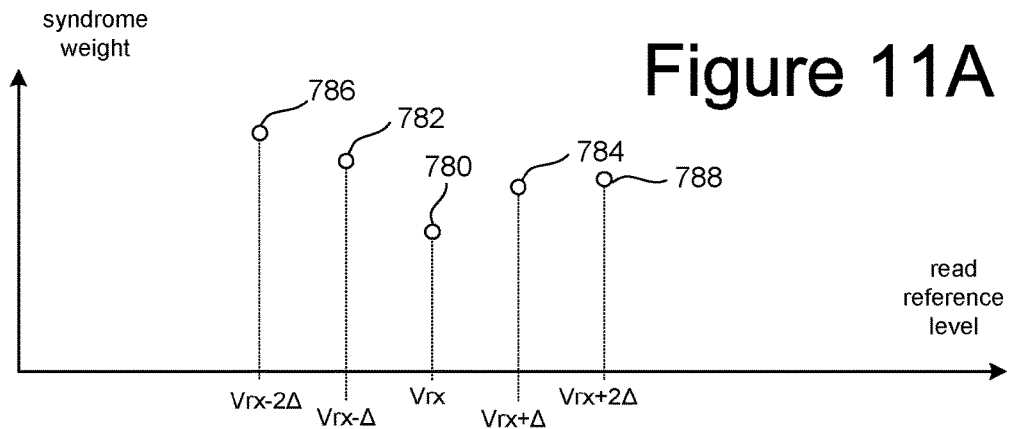
FIG. 11A is a graph plotting syndrome weight versus read reference voltage.

For the embodiment of FIG. 11, the initial predetermined samples using initial sets of read reference voltages (see step 606 of FIG. 9) comprises three samples. However, other numbers of initial predetermined samples can be used. In step 750 of FIG. 11, the syndrome weight for all three samples are compared. If the middle sample has the lowest syndrome weight (step 752), then in step 754 a new set of X (e.g, X=2) test read reference voltages are determined as +/−steps (Δ) from the edge test read reference voltages. For example, if the initial predetermined samples of step 606 were for test read reference voltages Vrx−Δ, Vrx and Vrx+Δ of FIG. 11A, then syndrome weight 780 for test read reference voltage Vrx is lower than syndrome weight 782 and syndrome weight 784; therefore, the new set of test read reference voltages in step 754 are Vrx−2Δ and Vrx+2Δ of FIG. 11A.

If, in step 752, it is determined that the middle sample does not have the lowest syndrome weight of the three, then in step 770 the system compares the syndrome weight for the sample with lowest test read reference voltage to the syndrome weight for sample with highest test read reference voltage. If the syndrome weight for the sample with lowest test read reference voltage is lower than the syndrome weight for sample with highest test read reference voltage (step 772) then in step 774 a new set of X (e.g, X=2) test read reference voltages are determined as minus steps (Δ) from the sample with the lowest test read reference voltage. For example, looking back at FIG. 8C, if the initial predetermined samples of step 606 were for test read reference voltages Vrx+Δ, Vrx+2Δ and Vrx+3Δ of FIG. 8C, then the new set of test read reference voltages are Vrx and Vrx−Δ.

If the syndrome weight for the sample with highest test read reference voltage is lower than the syndrome weight for the sample with the lowest test read reference voltage (step 772) then in step 776 a new set of X (e.g, X=2) test read reference voltages are determined as plus steps (Δ) from the sample with highest test read reference voltage. For example, looking back at FIG. 8B, if the initial predetermined samples of step 606 were for test read reference voltages Vrx−Δ, Vrx and Vrx+Δ of FIG. 8B, then the new set of test read reference voltages are Vrx+2Δ and Vrx+3Δ.

After steps 754, 774, or 776, the process continues at step 756 and the memory die 206 sense X samples of the page using the new test read reference voltages and (optionally) other read reference voltage(s). In step 758, the adaptive sensing is complete and N (e.g., N=5) samples are returned. Steps 750, 752, 754, 770, 772 and 774 can be performed by controller 120 (read calibration manager RC) or state machine 312.

Figure 12A:
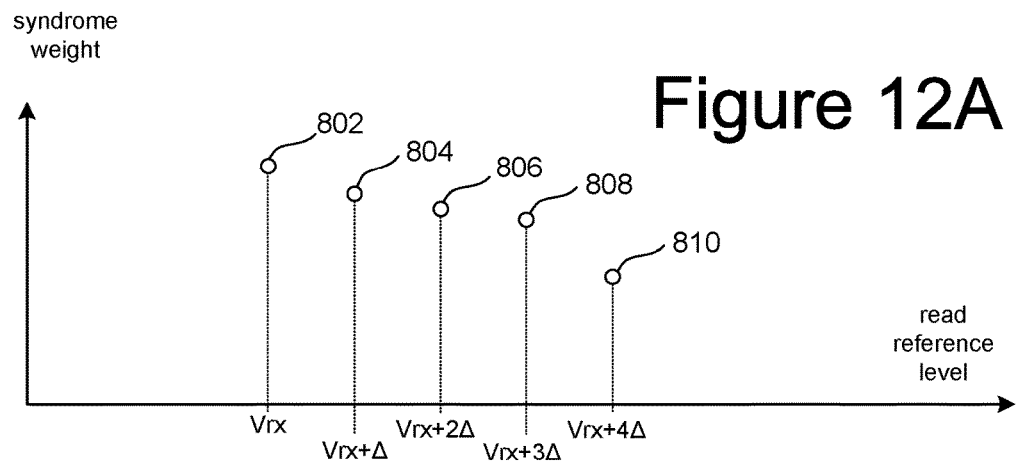
FIGS. 12A and 12B are graphs plotting syndrome weight versus read reference voltage.

FIG. 12A is a graph of syndrome weights plotted against read reference voltage for an example set of data created using the process of FIG. 9 in conjunction with the process of FIG. 10 or FIG. 11. FIG. 12A shows syndrome weights 802, 804, 806, 808 and 810 for read reference levels Vrx, Vrx+Δ, Vrx+2Δ, Vrx+3Δ and Vrx+4Δ. In this example, syndrome weight 810 is the lowest syndrome weight; however, it cannot be verified from the data of FIG. 12A that syndrome weight 810 is the minimum syndrome weight for samples that vary read reference level Vrx. The process for determining updated read reference voltages (e.g., see step 612 of FIG. 9 or step 510 of FIG. 7) may be more accurate if one of the samples used corresponds to the minimum syndrome weight for samples that vary the read reference level. Therefore, one embodiment includes continuing to obtain samples by performing sensing of the memory cells using the other test read reference levels until a minimum syndrome weight (indication of error) is identified because higher syndrome weights (indications of error) are associated with a previous sample and a subsequent sample. This is depicted graphically in FIG. 12B.

Figure 12B:
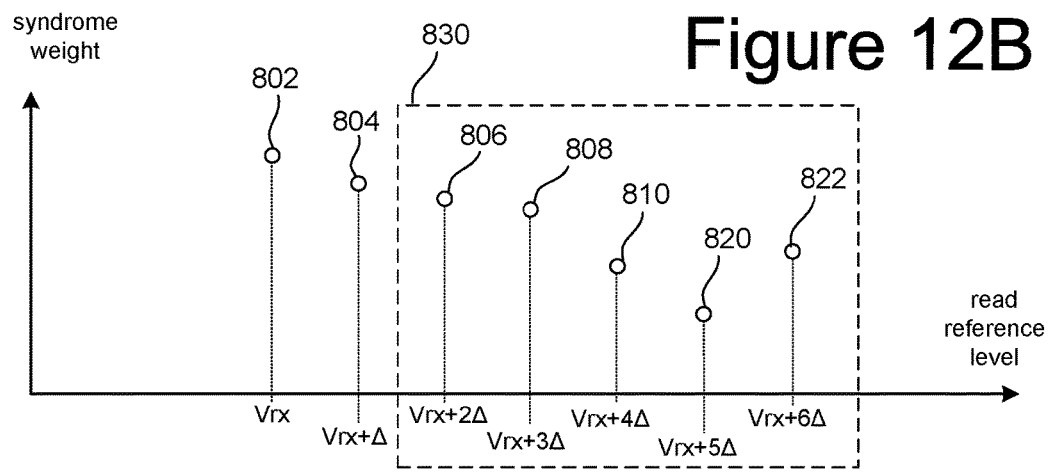

FIG. 12B is a graph of syndrome weights plotted against read reference voltages and shows the five syndrome weights 802, 804, 806, 808 and 810 that are also depicted in FIG. 12A and that we obtained by performing the process of FIG. 9. Because a minimum syndrome weight was not verifiably identified after five samples, additional samples were sensed until a minimum syndrome weight was verified to exits. In the case of FIG. 12B, the additional samples includes using test read reference levels Vrx+5Δ and Vrx+6Δ to obtain syndrome weights 820 and 822, respectively. As syndrome weight 820 is lower than syndrome weight 810 for the previous sample and syndrome weight 822 for the subsequent sample, syndrome weight 820 is verified to be a minimum syndrome weight. In this embodiment, the system continues to take additional samples until a minimum syndrome weight is identified; however, only a subset 830 of samples are used for determining updated read reference voltages (e.g., see step 612 of FIG. 9 or step 510 of FIG. 7). In one example, only five samples are used for determining updated read reference voltages; however, amounts other than five can also be implemented.

FIG. 13 is a flow chart describing one embodiment of a process for performing adaptive sensing that takes additional samples until a minimum syndrome weight is identified, as discussed above with respect to FIG. 12B. That is, the process of FIG. 13 is one example implementation of step 610 of FIG. 9. In one embodiment, the process of FIG. 13 is performed at the direction of controller 120, such as by read calibration manager (RC). In another embodiment, the process of FIG. 13 is performed entirely on the memory die 206 at the direction of the state machine.

In step 860 of FIG. 13, the system compares the syndrome weight (or other indication of error) for the sample with the lowest test read reference voltage to the syndrome weight for the sample with the highest test read reference voltage, similar to step 702 of FIG. 10. If the syndrome weight for the sample with the lowest test read reference voltage is less than the syndrome weight for the sample with the highest test read reference voltage (step 862), then in step 864 the new test read reference voltage is chosen to be the lowest test read reference voltage less a step size (or less a different amount). Step 864 is similar to step 706 of FIG. 10. If the syndrome weight for the sample with the highest test read reference voltage is less than the syndrome weight for the sample with the lowest test read reference voltage (step 862), then in step 866 the new test read reference voltage is chosen to be the highest test read reference voltage plus a step size (or plus a different amount). Step 866 is similar to step 708 of FIG. 10. Steps 860-866 can be performed by controller 120 (read calibration manager RC) or state machine 312.

After steps 864 or 866, the process continues at step 868 in which memory die 206 senses the page of data using the new test read reference voltage, as well as other read reference voltages (if necessary to sense the page of data). In step 870, indication of error manager (IOE) or syndrome weight calculation circuit 318 calculates a syndrome weight (or other indication of error) for the sample just sensed in the most recent performance of step 868. In step 872, it is determined whether the minimum number of samples have been taken. In one embodiment, the process for determining updated read reference voltages (e.g., see step 612 of FIG. 9 or step 510 of FIG. 7) requires at least five samples; however, in other embodiments a different the minimum number of samples can be implemented. If the minimum number of samples has not yet been taken, then the process loops back to step 860 so that another sample can be taken.

If the minimum number of samples has been taken (step 872), then in step 874 it is determined whether a minimum syndrome weight (or other indication of error) is identified because higher syndrome weights (or other indications of error) are associated with a previous sample and a subsequent sample. If a minimum syndrome weight (or other indication of error) is identified, then the adaptive sensing is complete and N (e.g., N=5) samples are returned in step 878. Note that although more than N samples were taken, only N samples are returned in the result set to be used for the process for determining updated read reference voltages (e.g., see step 612 of FIG. 9 or step 510 of FIG. 7). For example, FIG. 12B shows seven samples taken, but only the five samples in box 830 are returned in the result set to be used for the process for determining updated read reference voltages (e.g., see step 612 of FIG. 9 or step 510 of FIG. 7).

If a minimum syndrome weight (or other indication of error) is not identified (step 874), then in step 876 it is determined if a maximum number of samples have already been taken as there should be a limit on number of samples to prevent the process from never ending. If the maximum number of samples have already been taken, then then the adaptive sensing is complete and the latest N (e.g., N=5) samples (or the N samples with the smallest syndrome weights) are returned in step 878. If the maximum number of samples have not already been taken, then the process loops back to step 860 so that another sample can be taken.

Figure 14:
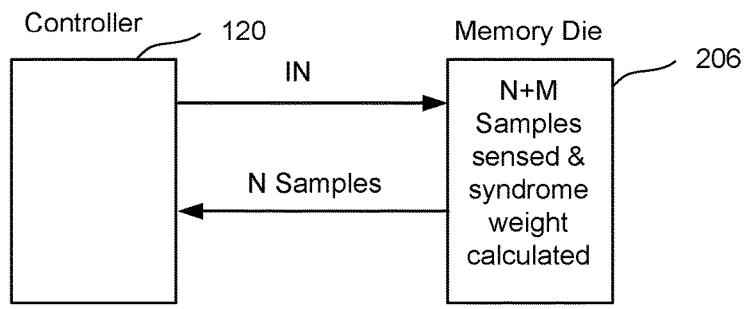
FIG. 14 is a block diagram depicting a controller and a memory die.

In one embodiment, syndrome weight calculation circuit 318 of memory die 206 calculates the syndrome weights and state machine 312 performs the process of FIG. 13 so that the process of FIG. 13 is performed completely on memory die 206. As such, memory die 206 determines the indications of error and chooses the subset of samples to send to the controller, where the subset of samples includes the sample with the minimum indication of error. Looking back at FIG. 12B, only the samples within box 830 are transmitted from memory die 206 to controller 120. This is depicted graphically in FIG. 14, which shows controller 120 sending instructions IN to memory die 206 to perform the adaptive sensing of FIG. 13. In response to those instructions IN, memory die 206 performs N+M sensing operations to obtain N+M samples. Memory die 206 also calculates the syndrome weights for the N+M samples, identifies the sample with the minimum syndrome weight having higher syndrome weights associated with a previous sample and a subsequent sample, and transmits N samples (which includes the sample with the minimum syndrome weight) to controller 120.

Figure 15:
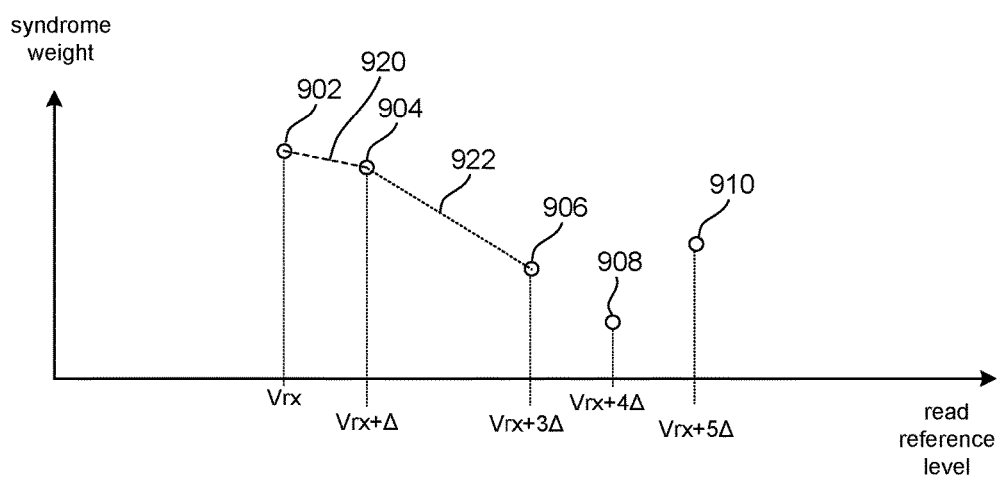
FIG. 15 is a graph plotting syndrome weight versus read reference voltage.

In some of the examples discussed above, the step size Δ for changing the read reference level was constant. In other embodiments, the step size Δ for changing the read reference level can vary between samples. FIG. 15 illustrates an example where the step size Δ is dynamically calculated for each sample (or for a subset of samples) based on rate of change of syndrome weight or other indication of error for previous samples. FIG. 15 shows data for five samples having syndrome weights of 902, 904, 906, 908 and 910. The step size for the third sample is calculated based on the rate of change between syndrome weight 902 and syndrome weight 904. For example, line 920 connects syndrome weight 902 and syndrome weight 904. The system can determine the next step size (after syndrome weight 904) based on the slope of line 920. Line 922 connected syndrome weight 904 and syndrome weight 906. The system can determine the next step size (after syndrome weight 906) based on the slope of line 922. The step size can also be determined based on the gradient for previous samples. In one embodiment, a smaller rate of change results in a larger step size and a larger rate of change results in a smaller step size. In the example of FIG. 15, the smaller slope of line 920 results in a larger step size (ie 2Δ) between the second and third samples. The larger slope of line 922 results in a smaller step size (ie Δ) between the third sample (Vrx+3Δ) and fourth sample (Vrx+4Δ).

Figure 16:
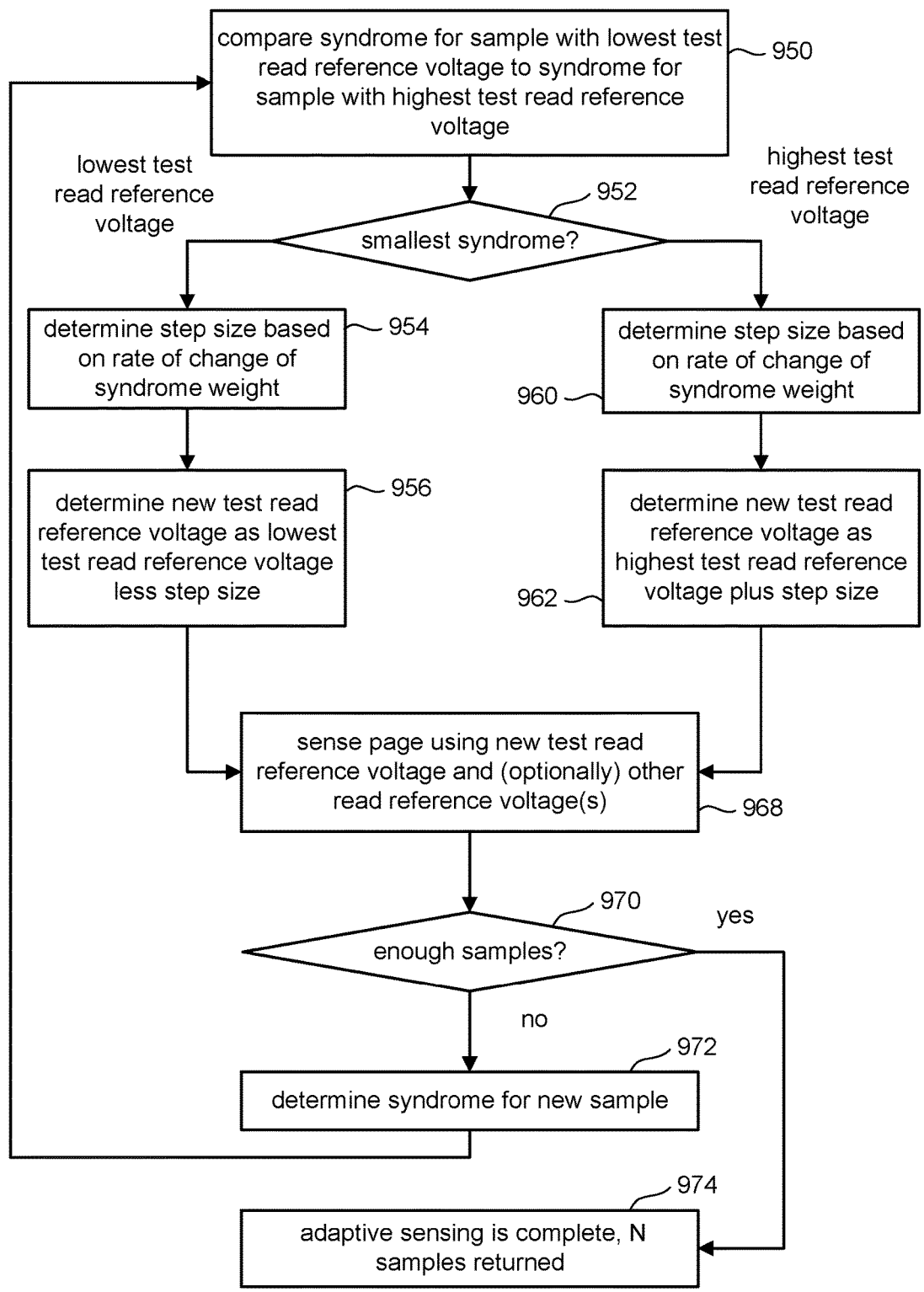
FIG. 16 is a flow chart describing one embodiment of a process for performing adaptive sensing.

FIG. 16 is a flow chart describing one embodiment of a process for performing adaptive sensing that dynamically calculates a step size based on rate of change of indication of error for previous samples. The process of FIG. 16 is one example implementation of step 610 of FIG. 9. In one embodiment, the process of FIG. 16 is performed at the direction of controller 120, such as by read calibration manager (RC). In another embodiment, the process of FIG. 16 is performed entirely on the memory die 206 at the direction of the state machine. In step 950 of FIG. 16, the system compares the syndrome weight (or other indication of error) for the sample with the lowest test read reference voltage to the syndrome weight for the sample with the highest test read reference voltage, similar to step 702 of FIG. 10. If the syndrome weight for the sample with the lowest test read reference voltage is less than the syndrome weight for the sample with the highest test read reference voltage (step 952), then in step 954 a step size is determined based on rate of change of syndrome weight for previous samples. In one example, if the gradient is greater than a threshold, then a small step size is chosen; otherwise, a large step size is chosen. In another example, the step size can be a continuous function of gradient. In step 956, the new test read reference voltage is chosen to be the lowest test read reference voltage less the step size calculated in step 954.

If the syndrome weight for the sample with the highest test read reference voltage is less than the syndrome weight for the sample with the lowest test read reference voltage (step 952), then in step 960 a step size is determined based on rate of change of syndrome weight for previous samples. In step 962, the new test read reference voltage is chosen to be the highest test read reference voltage plus the step size calculated in step 960. Steps 950-962 can be performed by controller 120 (read calibration manager RC) or state machine 312.

After steps 956 or 962, the process continues at step 968 in which memory die 206 senses the page of data using the new test read reference voltage, as well as other read reference voltages (if necessary to sense the page of data). In step 970, it is determined whether enough samples of data have been collected. In one embodiment, the system collects five samples of data for each read reference voltage that is calibrated. Step 970 is performed by controller 120 (read calibration manager RC) or state machine 312. If there are not enough samples yet, then in step 972 indication of error manager (IOE) or syndrome weight calculation circuit 318 calculates a syndrome weight (or other indication of error) for the sample just sensed in the most recent performance of step 968. After step 972, the process continues at 950 to choose another sample. If, in step 970, it is determined that the there are enough samples, then the adaptive sensing is complete and N (e.g., N=5) samples are returned in step 974.

One embodiment includes an apparatus, comprising a plurality of non-volatile memory cells and one or more control circuits connected to the memory cells. The one or more control circuits are configured to perform initial sensing of the memory cells using test read reference levels and calculate indications of error for the initial sensing. The one or more control circuits are configured to choose additional test read reference levels based on the indications of error for the initial sensing and perform additional sensing of the memory cells using the additional test read reference levels. The one or more control circuits are configured to determine updated read reference levels based on the initial sensing and the additional sensing.

In some examples, the one or more control circuits configured to choose other read reference levels based on indication of error for previous samples; the one or more control circuits configured to perform further sensing of the memory cells using the other read reference levels; and the one or more control circuits configured to determine the updated read reference levels based on the initial sensing, the additional sensing and the further sensing. Additionally, in some implementations, the one or more control circuits are configured to choose at least one of the other read reference levels by comparing an indication of error for a sample with lowest test read reference level to an indication of error for a sample with highest test read reference level, choosing a new test read reference level that is lower than the lowest test read reference level if the indication of error for the sample with lowest test read reference level is lower than indication of error for the sample with highest test read reference level and choosing a new test read reference level that is higher than the highest test read reference level if the indication of error for the sample with highest test read reference level is lower than indication of error for the sample with lowest test read reference level.

One embodiment includes a method for determining updated read reference levels, comprising: sensing initial samples for non-volatile memory cells using initial sets of read reference levels; determining syndrome weights for the initial samples; choosing additional sets of read reference levels based on syndrome weights determined for previous samples and sensing additional samples using the additional sets of read reference levels; determining the updated read reference levels based on the initial predetermined samples and the additional samples; and reading the non-volatile memory cells using the updated read reference levels.

One embodiment includes an apparatus, comprising: a plurality of non-volatile memory cells; means for sensing the non-volatile memory cells using read reference voltages to create sensed samples; means for determining syndrome weights for sensed samples; means for dynamically choosing test read reference voltages based on syndrome weights determined for previous sensed samples, creating test data using the test read reference voltages subsequent to the choosing of the test read reference voltages and using the test data to update the read reference voltages; and means for reading data stored in the non-volatile memory cells using the calibrated read reference voltages.

In one embodiment, the means for sensing includes the read/write circuits 328 and state machine 312 of FIG. 2. However, other electrical circuits or processors can also be used to sense memory cells.

In one embodiment, the means for determining syndrome weights for sensed samples includes indication of error manager (TOE) or syndrome weight calculation circuit 318. However, other electrical circuits or processors (with or without software) can also be used to determine syndrome weights or other indications of error.

In one embodiment, the means for dynamically choosing test read reference voltages includes controller 120 (e.g., read calibration manager RC), state machine 312 or another processor (with or without software) performing the processes of FIG. 10, 11, 13 or 16.

In one embodiment, the means for reading data can include a combination of controller 120, control circuitry 310 and/or read/write circuits 328. Other circuits and/or processors can also be used to read data from the memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells; and
one or more control circuits connected to the memory cells, the one or more control circuits configured to read data from the memory cells using a read reference level, the one or more control circuits configured to update the read reference level by:
performing initial sensing of the memory cells using a predetermined test read reference level and a second test read reference level,
calculating indications of error for the initial sensing including calculating a first indication of error for sensing the memory cells using the predetermined test read reference level and a second indication of error for sensing the memory cells using the second test read reference level,
comparing the first indication of error for sensing the memory cells to the second indication of error for sensing the memory cells,
dynamically choosing a first additional test read reference level based on the comparing of the first indication of error for sensing the memory cells to the second indication of error for sensing the memory cells,
performing additional sensing of the memory cells using the dynamically chosen first additional test read reference level and other additional test read reference levels calculated based on comparing multiple previous indications of error for sensing the memory cells,
calculating indications of error for the additional sensing, and
choosing an updated read reference level based on the indications of error for the initial sensing and the indications of error for the additional sensing.

2. The apparatus of claim 1, wherein:
the one or more control circuits configured to perform further sensing of the memory cells until a minimum indication of error is identified because higher indications of error are associated with a previous sample and a subsequent sample; and
the one or more control circuits configured to determine the updated read reference levels based on the initial sensing, the additional sensing and the further sensing.

3. The apparatus of claim 2, wherein:
the plurality of non-volatile memory cells are formed on a memory die;

the one or more control circuits include a circuit on the memory die and a controller circuit off of the memory die; and the subset of samples includes the sample with the minimum indication of error.

4. The apparatus of claim 1, wherein:

the one or more control circuits configured to calculate a step size based on rate of change of indication of error for previous samples; and the one or more control circuits configured to choose the additional test read reference levels based on the previous indications of error for sensing the memory cells and the calculated step size.

5. The apparatus of claim 1, wherein:

the plurality of non-volatile memory cells are formed on a memory die;

the one or more control circuits include a state machine circuit on the memory die and a controller circuit off of the memory die;

the state machine configured to perform the initial sensing, the dynamically choosing the first additional test read reference level and the additional sensing; and the controller configured to determine the updated read reference levels.

6. The apparatus of claim 1, wherein:

the indications of error are syndrome weights.

7. The apparatus of claim 1, wherein:

the additional test read reference levels are voltages.

8. The apparatus of claim 1, wherein:

the one or more control circuits are configured to read data using the updated read reference levels.

9. An apparatus, comprising:

a plurality of non-volatile memory cells; and one or more control circuits connected to the memory cells, the one or more control circuits configured to perform initial sensing of the memory cells using test read reference levels and calculate indications of error for the initial sensing, the one or more control circuits configured to choose additional test read reference levels based on the indications of error for the initial sensing and perform additional sensing of the memory cells using the additional test read reference levels, the one or more control circuits configured to determine updated read reference levels based on the initial sensing and the additional sensing;

the one or more control circuits configured to choose the additional read reference levels based on the indications of error for the initial sensing by comparing an indication of error for a sample with a lowest test read reference level to an indication of error for a sample with a highest test read reference level, choosing a new test read reference level that is lower than the lowest test read reference level if the indication of error for the sample with the lowest test read reference level is lower than the indication of error for the sample with the highest test read reference level and choosing a new test read reference level that is higher than the highest test read reference level if the indication of error for the sample with the highest test read reference level is lower than the indication of error for the sample with the lowest test read reference level.

10. A method for determining updated read reference levels, comprising:

sensing initial samples for non-volatile memory cells using initial sets of read reference levels;

determining syndrome weights for the initial samples;

choosing additional sets of read reference levels based on syndrome weights determined for previous samples and sensing additional samples using the additional sets of read reference levels until a minimum syndrome weight is identified between two higher syndrome weights;

determining the updated read reference levels based on the initial samples and the additional samples; and reading the non-volatile memory cells using the updated read reference levels.

11. The method of claim 10, wherein the choosing additional sets of read reference levels comprises:

comparing a syndrome weight for a sample with lowest read reference level to a syndrome weight for a sample with highest read reference level;

choosing a new read reference level that is lower than the lowest read reference level in response to the syndrome weight for the sample with lowest read reference level being lower than the syndrome weight for the sample with highest read reference level; and choosing a new test read reference level that is higher than the highest read reference level in response to the syndrome weight for the sample with highest read reference level being lower than the syndrome weight for the sample with lowest test read reference level.

12. The method of claim 10, wherein the choosing additional sets of read reference levels comprises:

comparing a syndrome weight for a sample with lowest read reference level, a syndrome weight for a sample with highest read reference level, and a syndrome weight for a sample with a middle read reference level;

choosing multiple new read reference levels that are lower than the lowest test read reference level in response to the syndrome weight for the sample with lowest read reference level being lower than the syndrome weight for the sample with highest read reference level and the syndrome weight for the sample with the middle read reference level;

choosing multiple new read reference levels that are higher than the highest read reference level in response to the syndrome weight for the sample with highest read reference level being lower than the syndrome weight for the sample with lowest read reference level and the syndrome weight for the sample with the middle read reference level; and choosing a choosing a new test read reference level that is lower than the lowest read reference level and choosing a new read reference level that is higher than the highest read reference level in response to the syndrome weight for the sample with the middle read reference level being smaller than the syndrome weight for the sample with lowest read reference level and the syndrome weight for the sample with highest read reference level.

13. The method of claim 10, further comprising:

determining a step size between read reference levels of the additional sets of read reference levels based on rate of change of syndrome weights for previous samples.

14. The method of claim 10, wherein:

the non-volatile memory cells are on a memory die;

the sensing is performed on the memory die;

the determining syndrome weights is performed on the memory die;

the choosing additional sets of read reference levels are performed on the memory die; and the determining the updated read reference levels is performed by a controller circuit off of the memory die.

\* \* \* \* \*